United States Patent
Cheng

(10) Patent No.: US 10,014,222 B2
(45) Date of Patent: *Jul. 3, 2018

(54) FABRICATION OF A VERTICAL FIN FIELD EFFECT TRANSISTOR WITH REDUCED DIMENSIONAL VARIATIONS

(71) Applicant: INTERNATIONAL BUSINESS MACHINES CORPORATION, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/627,927

(22) Filed: Jun. 20, 2017

(65) Prior Publication Data

US 2018/0005900 A1    Jan. 4, 2018

Related U.S. Application Data

(63) Continuation of application No. 15/199,352, filed on Jun. 30, 2016, now Pat. No. 9,768,072.

(51) Int. Cl.
*H01L 21/06* (2006.01)
*H01L 29/06* (2006.01)
(Continued)

(52) U.S. Cl.
CPC .............. *H01L 21/823487* (2013.01); *H01L 21/02532* (2013.01); *H01L 21/02598* (2013.01); *H01L 21/3065* (2013.01); *H01L 21/3086* (2013.01); *H01L 21/823412* (2013.01); *H01L 27/088* (2013.01); *H01L 29/0603* (2013.01); *H01L 27/10826* (2013.01); *H01L 27/1104* (2013.01)

(58) Field of Classification Search
None
See application file for complete search history.

(56) References Cited

U.S. PATENT DOCUMENTS 7,446,366 B2    11/2008    Paranjpe et al.
7,713,881 B2    5/2010    Paranjpe
(Continued)

OTHER PUBLICATIONS

List of IBM Patents or Patent Applications Treated as Related dated Jun. 20, 2017, 2 pages.
(Continued)

*Primary Examiner* — Alexander Ghyka
(74) *Attorney, Agent, or Firm* — Tutunjian & Bitetto, P.C.; Vazken Alexanian

(57) ABSTRACT

A method of forming a fin field effect transistor (finFET) having fin(s) with reduced dimensional variations, including forming a dummy fin trench within a perimeter of a fin pattern region on a substrate, forming a dummy fin fill in the dummy fin trench, forming a plurality of vertical fins within the perimeter of the fin pattern region, including border fins at the perimeter of the fin pattern region and interior fins located within the perimeter and inside the bounds of the border fins, wherein the border fins are formed from the dummy fin fill, and removing the border fins, wherein the border fins are dummy fins and the interior fins are active vertical fins.

10 Claims, 11 Drawing Sheets

(51) Int. Cl.
  *H01L 21/8234* (2006.01)
  *H01L 21/02* (2006.01)
  *H01L 27/088* (2006.01)
  *H01L 21/3065* (2006.01)
  *H01L 21/308* (2006.01)
  *H01L 27/11* (2006.01)
  *H01L 27/108* (2006.01)

(56) References Cited

U.S. PATENT DOCUMENTS

| | | | |
|---|---|---|---|
| 8,420,459 B1 | 4/2013 | Cheng et al. | |
| 8,502,279 B2 | 8/2013 | Toh et al. | |
| 8,592,290 B1 | 11/2013 | Basker et al. | |
| 8,604,539 B2 | 12/2013 | Cheng et al. | |
| 8,623,712 B2 | 1/2014 | Cheng et al. | |
| 8,703,557 B1 | 4/2014 | Cai et al. | |
| 8,846,490 B1 | 9/2014 | Shieh et al. | |
| 8,928,067 B2 | 1/2015 | Cheng et al. | |
| 8,999,774 B2 | 4/2015 | Cheng et al. | |
| 9,263,287 B2 | 2/2016 | Tsao et al. | |
| 9,768,072 B1 * | 9/2017 | Cheng | H01L 21/823487 |
| 2013/0277744 A1 | 10/2013 | Lee et al. | |
| 2013/0309838 A1 | 11/2013 | Wei et al. | |
| 2014/0349468 A1 | 11/2014 | Suzuki et al. | |
| 2015/0206759 A1 | 7/2015 | Tsao et al. | |
| 2015/0279959 A1 | 10/2015 | Qi et al. | |
| 2016/0111286 A1 | 4/2016 | Wen et al. | |
| 2016/0197005 A1 | 7/2016 | Tsao et al. | |
| 2016/0293638 A1 | 10/2016 | Doris et al. | |
| 2016/0329248 A1 | 11/2016 | Liou et al. | |

OTHER PUBLICATIONS

U.S. Office Action issued in corresponding U.S. Appl. No. 15/798,886 dated Mar. 9, 2018, 7 pages.

* cited by examiner

FABRICATION OF A VERTICAL FIN FIELD EFFECT TRANSISTOR WITH REDUCED DIMENSIONAL VARIATIONS

BACKGROUND

Technical Field

The present invention generally relates to compensation for fin profile variations, and more particularly to an approach for reducing the dimensional variations between edge fins and interior fins while maintaining device density by removing edge fins.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming a fin field effect transistor (finFET) having fin(s) with reduced dimensional variations. The method includes the steps of forming a dummy fin trench within a perimeter of a fin pattern region on a substrate, and forming a dummy fin fill in the dummy fin trench. The method further includes the step of forming a plurality of vertical fins within the perimeter of the fin pattern region, including border fins at the perimeter of the fin pattern region and interior fins located within the perimeter and inside the bounds of the border fins, wherein the border fins are formed from the dummy fin fill. The method further includes the step of removing the border fins, wherein the border fins are dummy fins and the interior fins are active vertical fins.

In accordance with an embodiment of the present principles, a method is provided for forming a fin field effect transistor (finFET) having fin(s) with reduced dimensional variations. The method includes the steps of forming at least one dummy fin trench in a substrate, and forming a dummy fin fill in the at least one dummy fin trench. The method further includes the step of forming one or more dummy fins from the dummy fin fill and one or more vertical fins from the substrate by a sidewall image transfer process. The method further includes the step of removing the one or more dummy fins by a selective etch, while leaving the one or more vertical fins on the substrate. The method further includes the steps of forming a dielectric layer on the one or more vertical fins and at least a portion of the substrate, wherein the dielectric layer fills in at least a portion of the at least one dummy fin trench, and forming a gate structure on the one or more vertical fins.

In accordance with another embodiment of the present principles, a fin field effect transistor (finFET) having fin(s) with reduced dimensional variations is provided. The device includes a plurality of vertical fins within a perimeter of a fin pattern region on a substrate. The device further includes a step formed in the substrate around the plurality of vertical fins, and a dielectric layer on the step and at least a portion of the plurality of vertical fins.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
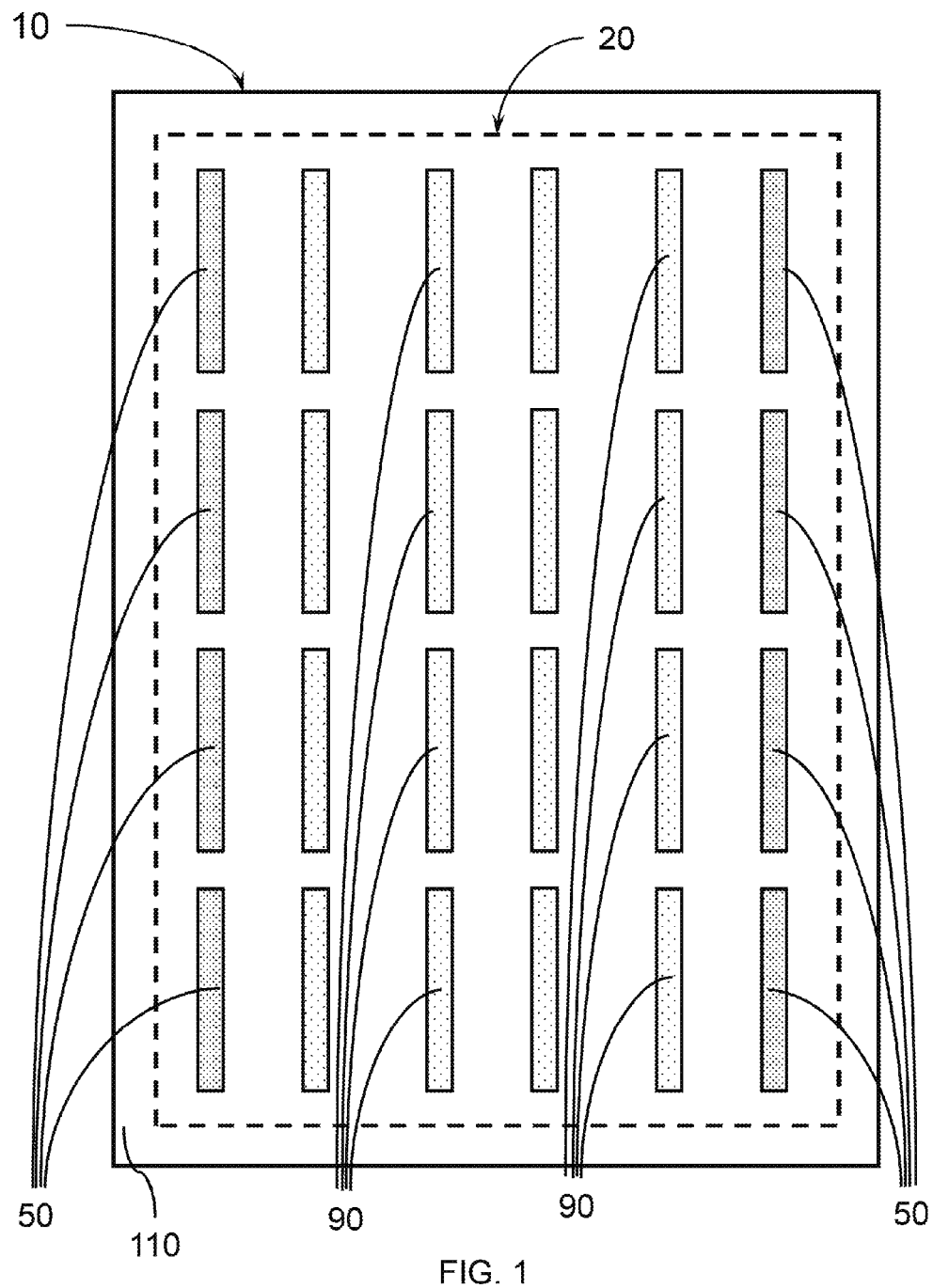
FIG. 1 is a top view of an array of vertical fins on a region of a substrate, in accordance with an exemplary embodiment.

Principles and embodiments of the present disclosure relate generally to controlling variations in vertical fin dimensions of fins located along the perimeter of a fin pattern region by forming dummy fins along the perimeter of the fin pattern region. After forming both functional and dummy fins in a vertical fin pattern, the dummy fins may be removed to leave remaining vertical fins with more consistent dimensions. The dummy fins may be made of a more easily removed and/or cheaper material that may be selectively etched relative to the functional vertical fins.

Due to micro-loading effects (i.e., decreased local etchant concentrations), fins at a fin array edge usually end up with different profiles (e.g., more sloped and wider) than interior fins inside the border fins. In various embodiments, the vertical fins remaining after removal of the dummy fins may have a more uniform profile. Differences in the pattern density may affect the etch rate of a semiconductor material being used to form a vertical fin. This may be particularly pronounced along a perimeter of a fin pattern region, where the fins at the border of the region may have a neighboring fin on only one side. Adjustment of the vertical fin pattern to include a dummy fin adjacent to an intended border fin, where the dummy fin may be removed later in the process, may compensate for the difference in fin pattern density at the perimeter.

Principles and embodiments of the present disclosure also relate generally to selectively forming and removing dummy fins along the perimeter of and/or within a fin pattern region as a fin-cut process to fabricate a predetermined pattern of active fin(s) within a fin pattern region. After forming both functional and dummy fins in a vertical fin pattern, the dummy fins may be removed to leave remaining vertical fins in a predetermined arrangement on the substrate. The placement of one or more dummy fins may also define the location of a subsequently formed isolation region within a pattern of active fin(s).

Exemplary applications/uses to which the present principles can be applied include, but are not limited to: formation of vertical finFETs, complementary metal oxide silicon (CMOS) field effect transistors (FETs) formed by coupled finFETs, and digital gate devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, which is a top view of an array of vertical fins on a region of a substrate, in accordance with an exemplary embodiment.

In one or more embodiments, a plurality of vertical fins may be arranged in a pattern on a substrate, where the vertical fins forming a fin pattern 20 (e.g., a M×N array) may include border fins 50 at the perimeter of the fin pattern region 10 and interior fins 90 located within the perimeter and inside the bounds of the border fins 50. A fin pattern region 10 may be defined by a difference in the fin arrangement compared to one or more neighboring fin pattern regions on the substrate 100 that distinguish the fin pattern regions, where the difference may be, for example, different fin sizes (i.e., fin dimensions) fin pitches, array dimensions (e.g., M×N vs. X×Y, M≠X and N≠Y). A fin pattern region 10 may also be defined by an isolation region between one or more neighboring fin pattern regions, and/or fin-cut regions, where there has been an increase in the distance between adjacent fins, for example by removal of vertical fin(s).

In various embodiments, the border fins 50 may include the fin(s) in the same column along opposite edges of a fin pattern region 10. Fin(s) in the same row at the top and/or bottom of the same fin pattern region may also be border fin(s) 50, whereas fin(s) inside this perimeter of border fins would be interior fins 90.

A border fin 50 may have a different profile (e.g., different taper angle) and/or dimensions (e.g., wider) than adjacent interior fin(s) 90 due to local variations in the etching process (e.g., decreased etching rate) used to form the vertical fins in a fin pattern region 10 on a substrate 110. Without intending to be bound by theory, it is believed that the concentration of reactive species depends on the fin pattern density within a certain radius, and that the etchant concentration increases with decreasing fin pattern density. The fin density along edges and at corners may be less because the border fins 50 only have adjacent fins on one side, and fins at the corners are exposed on two sides.

Principles and embodiments of the present disclosure relate to adjusting a fabrication process to address the different local densities experienced by the vertical fins in a fin pattern region 10 by forming sacrificial fins in place of the border fins 50 at the perimeter of the fin pattern region 10. By adjusting the fin pattern 20 to include at least one additional column of sacrificial vertical fin(s) along each of the edges of the fin pattern region 10, the variation in vertical fin size and/or profile may be compensated for. Device variations due to the variation in vertical fin size and/or profile may be avoided by selectively forming the border fins 50 of a material that may be preferentially etched relative to the interior fins 90, and selectively removing the border fins 50, as sacrificial dummy fins, to leave the interior fins 90 for device (e.g., finFET) fabrication. The interior fins 90 may have more consistent profiles and/or dimensions leading to reduced device performance variation, where the interior fins may be retained as active vertical fins for the fabrication of vertical or horizontal finFET(s).

Figure 2:
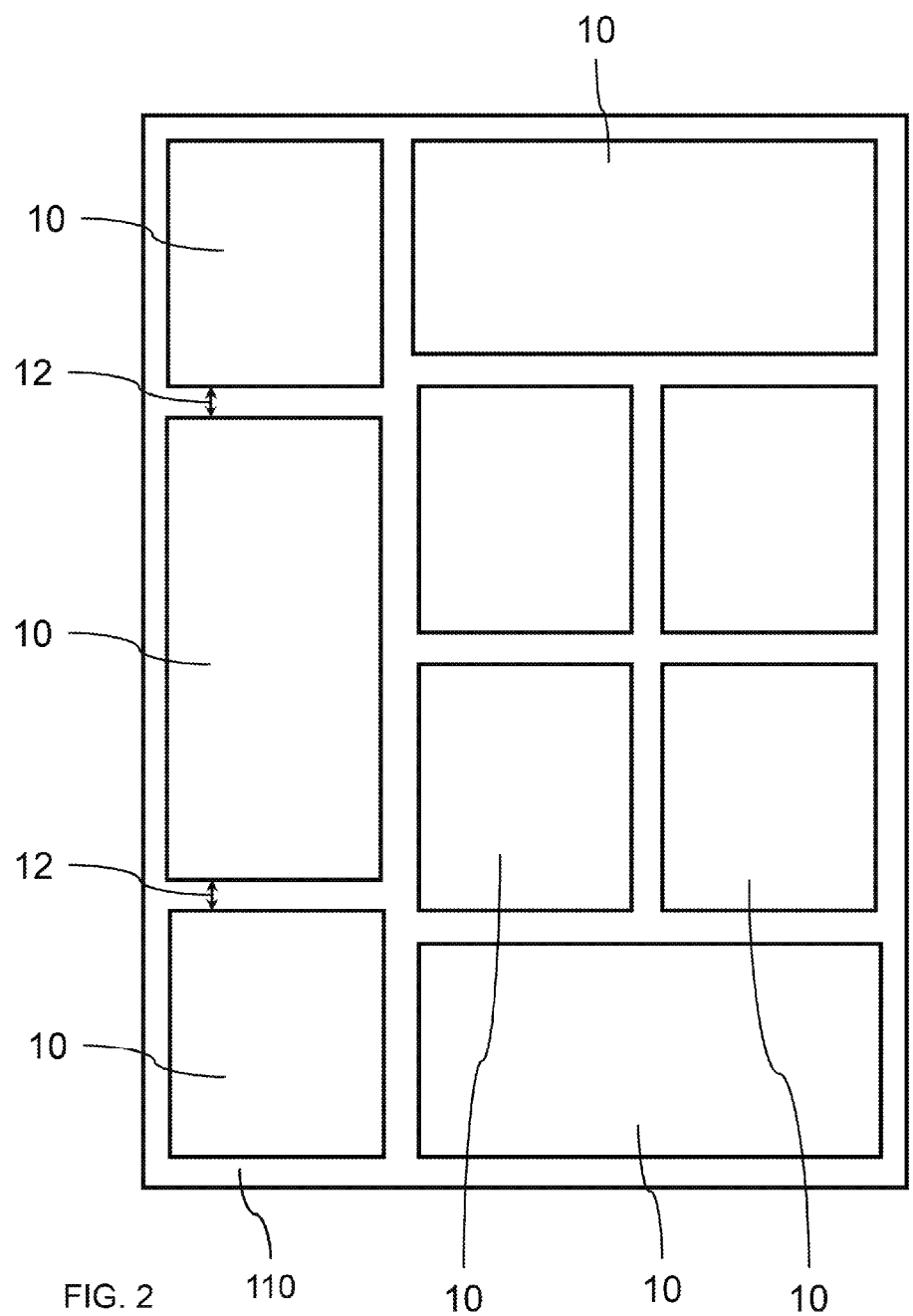
FIG. 2 is a top view of a layout of fin pattern regions on a substrate, in accordance with an exemplary embodiment.

FIG. 2 is a top view of a layout of fin pattern regions 10 on a substrate, in accordance with an exemplary embodiment.

In one or more embodiments, a plurality of fin pattern regions 10 with differing fin patterns 20 may be laid out on a substrate 110, where the different fin patterns may be predetermined to fabricate integrated circuit devices for different components, for example, dynamic random access memory (DRAM), static random access memory (SRAM), registers, processing cores, graphics processors, memory, heat and/or processing control circuits, input-output controllers, etc. Pattern region gap(s) 12 may be predetermined spaces present between different fin pattern regions 10, where the pattern region gaps may include spaces formed by the removal of the border fins 50 in neighboring fin pattern regions 10. Pattern region gaps 12 may be isolation regions to electrically separate different components and/or devices.

In various embodiments, more than one column and/or row of fins at the perimeter of a fin pattern region 10 may be formed as dummy fin(s) and removed, where the width of a pattern region gap 12 may be determined by the number of columns and/or rows of dummy fin(s) formed and removed.

Figure 3:
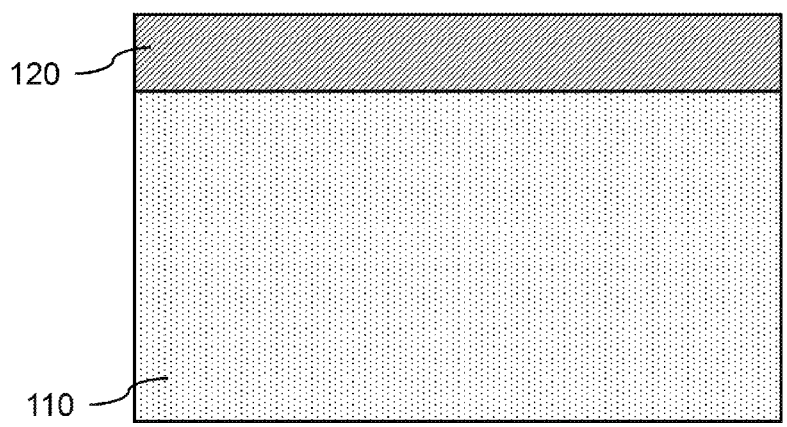
FIG. 3 is a cross-sectional side view of a substrate with a hardmask layer, in accordance with an exemplary embodiment.

FIG. 3 is a cross-sectional side view of a substrate with a hardmask layer, in accordance with an exemplary embodiment.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a hardmask layer 120 may be formed on an exposed surface of the substrate 110. The hardmask layer 120 may be formed by a thermal process, such as, for example, oxidation or nitridation of the top semiconductor layer, or the hardmask layer may be deposited, for example, by CVD or PVD. A combination of the various processes may also be used to form hardmask layer 120.

In various embodiments, the hardmask layer may be an oxide, for example, silicon oxide (SiO), a nitride, for example, a silicon nitride (SiN), or an oxynitride, for example, silicon oxynitride (SiON), or combinations thereof. In various embodiments, the hardmask layer 120 may be silicon nitride (SiN), for example, $Si_3N_4$. The hardmask layer 120 may be a single layer for example, a silicon nitride (SiN) layer, or the hardmask layer may include two or more layers, for example a silicon oxide (SiO) liner layer between the substrate surface and a silicon nitride ($Si_3N_4$) top layer. The liner layer may be a material different from a top layer 130, where the liner layer may act as an etch stop layer.

In one or more embodiments, the hardmask layer 120 may have a thickness in the range of about 20 nm to about 100 nm, or in the range of about 35 nm to about 75 nm, or in the range of about 45 nm to about 55 nm, although other thicknesses are contemplated. A liner layer may have a thickness in the range of about 1 nm to about 10 nm, or in the range of about 2 nm to about 5 nm.

Figure 4:
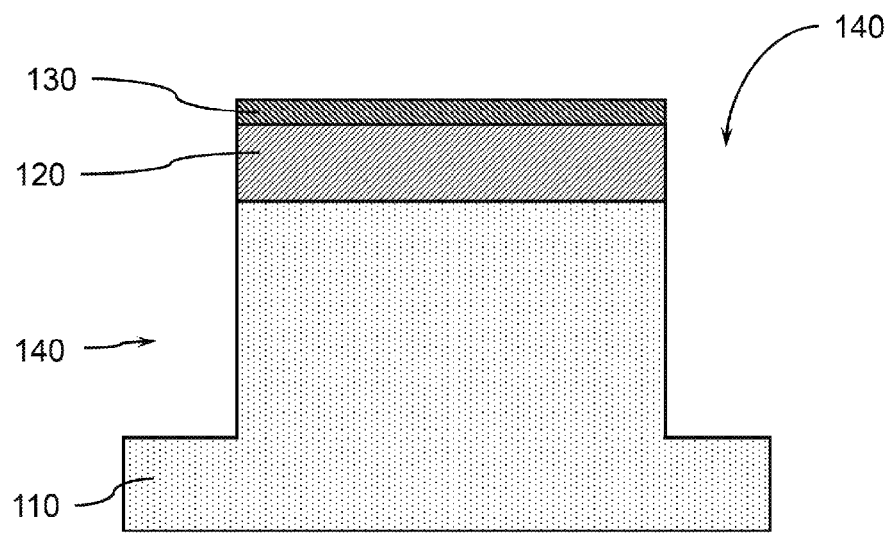
FIG. 4 is a cross-sectional side view of a substrate with a hardmask layer after formation of dummy fin trenches, in accordance with an exemplary embodiment.

FIG. 4 is a cross-sectional side view of a substrate with a hardmask layer after formation of dummy fin trenches, in accordance with an exemplary embodiment.

In one or more embodiments, a photoresist layer 130 may be formed on the hardmask layer 120. The photoresist layer 130 may be a temporary resist (e.g., poly methyl methacrylate (PMMA)) that may be deposited on the hardmask layer 120, patterned, and developed to expose portions of the hardmask layer 120. The photoresist layer may be a positive resist or a negative resist.

In one or more embodiments, at least a portion of the hardmask layer 120 may be masked by a photoresist layer 130 that can be patterned and developed to expose portions of the hardmask layer 120. Exposed portions of the hardmask layer 120 and underlying substrate 110 may be removed to form one or more dummy fin trenches 140, where the dummy fin trenches may be formed by a directional, dry plasma etch (e.g., reactive ion etch (RIE)).

In one or more embodiments, one or more sections of the substrate 110 may be removed to form the dummy fin trenches 140, where the substrate 110 may be removed to a depth approximately equal to or greater than an intended height of one or more vertical fin(s) to be formed from the substrate material adjacent to the dummy fin trench. In various embodiments, the depth of the dummy fin trench(es) may be in the range of 20 nm to about 200 nm, or about 40 nm to about 150 nm, or about 50 nm to about 100 nm, where the depth is measured from the top of the substrate 110 to the bottom surface of the trench. Other depths are also contemplated.

In various embodiments, formation of the dummy fin trench 140 may form a step with a ledge around one or more interior fins 90, where the dummy fin trench may subsequently form an isolation region having a depth greater than a depth of a bottom source/drain.

In various embodiments, the width of the one or more dummy fin trenches 140 may be in the range of about 30 nm to about 300 nm, or in the range of about 50 nm to about 200 nm, or in the range of about 80 nm to about 150 nm. In various embodiments, the width of the dummy fin trench 140 may be sufficient to form one dummy fin at the perimeter of a fin pattern region 10, where the dummy fin is located the same pitch distance from an adjacent interior fin 90, as the pitch between adjacent interior fins 90 in the same fin pattern 20.

Figure 5:
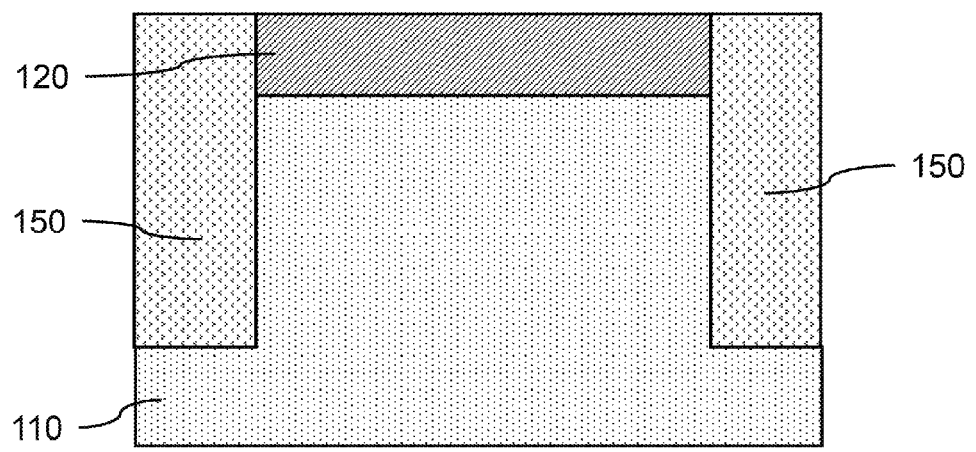
FIG. 5 is a cross-sectional side view of a dummy fin fill in the dummy fin trenches, in accordance with an exemplary embodiment.

FIG. 5 is a cross-sectional side view of a dummy fin fill in the dummy fin trenches, in accordance with an exemplary embodiment.

In one or more embodiments, a dummy fin fill 150 may be formed in the one or more dummy fin trenches 130, where the dummy fin fill may be a blanket deposition that fills the dummy fin trenches 140. The dummy fin fill may extend above the hardmask layer 120.

In one or more embodiments, the dummy fin fill 150 may be a material with an etch rate for an intended directional anisotropic etch (e.g., RIE) that is comparable to the etch rate of the substrate material, for example, a dummy fin fill 150 may be amorphous silicon (a-Si), poly-crystalline silicon (p-Si), amorphous silicon-germanium (a-SiGe), or poly-crystalline silicon-germanium (p-SiGe) when the substrate is single crystal silicon (Si).

In various embodiments, dummy fin fill 150 may be an amorphous or poly-crystalline III-V semiconductor material when the substrate is a single crystal III-V semiconductor material, where the amorphous or poly-crystalline III-V semiconductor material has a comparable etch rate to the single crystal III-V semiconductor material.

Figure 6:
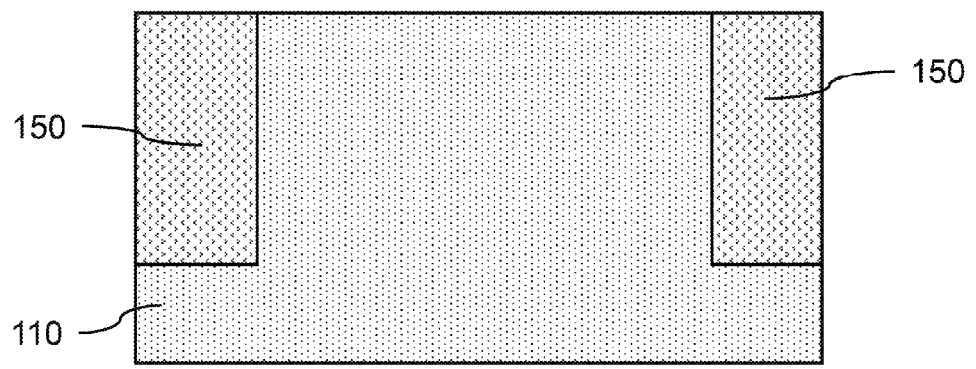
FIG. 6 is a cross-sectional side view of the substrate and dummy fin fill with a flat uniform surface after removal of the hardmask, in accordance with an exemplary embodiment.

FIG. 6 is a cross-sectional side view of the substrate and dummy fin fill with a flat uniform surface after removal of the hardmask, in accordance with an exemplary embodiment.

In one or more embodiments, a portion of the dummy fin fill 150 and the remaining portion of the hardmask 120 may be removed to expose a surface of the substrate 110 and dummy fin fill 150, where the surface of the substrate and dummy fin fill may be flat, smooth, and uniform. In various embodiments, the portion of the dummy fin fill 150 and hardmask layer 120 may be removed by a chemical-mechanical polishing (CMP). In various embodiments, the remaining portion of the hardmask 120 and/or dummy fin fill 150 may be removed by etching, and the surface prepared by CMP to provide a smooth, flat surface.

Figure 7:
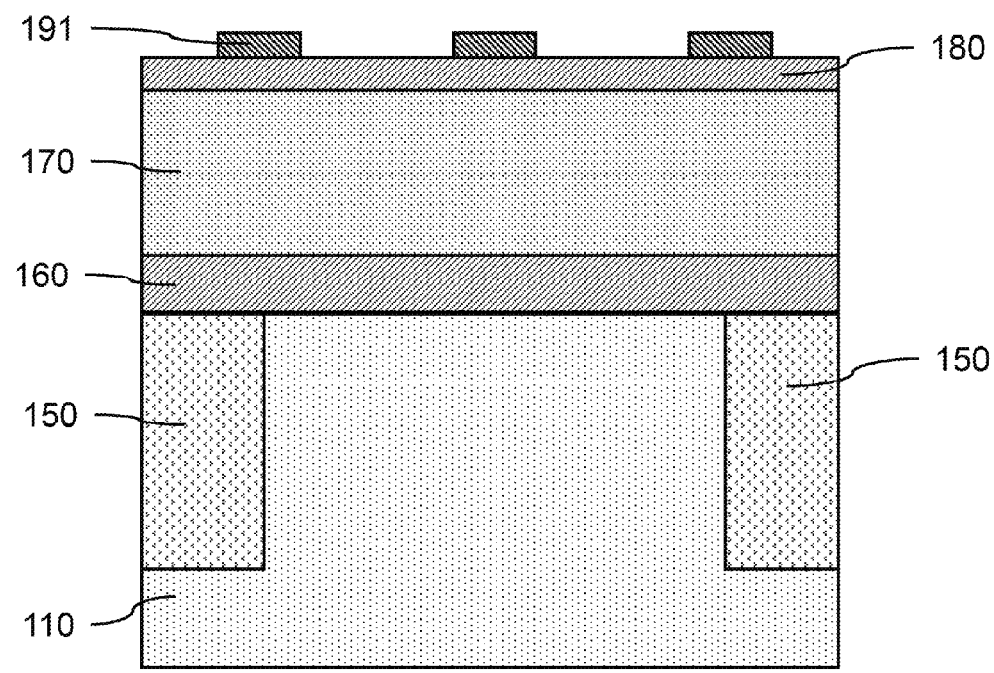
FIG. 7 is a cross-sectional side view of a masking layer, a mandrel layer, and a fin template layer on the substrate and dummy fin fill, in accordance with an exemplary embodiment.

FIG. 7 is a cross-sectional side view of a masking layer, a mandrel layer, and a fin template layer on the substrate and dummy fin fill, in accordance with an exemplary embodiment.

In one or more embodiments, a fin template layer 160 may be formed on at least a portion of the surface of the dummy fin fill 150 and substrate 110. A mandrel layer 170 may be formed on at least a portion of the fin template layer 160, where the mandrel layer may be utilized to form sacrificial mandrels for a sidewall image transfer (SIT) process of forming vertical fin(s). A masking layer 180 may be formed on at least a portion of the mandrel layer 170, where the masking layer may be a hard mask for etching portions of the mandrel layer 170. A photo mask layer may be formed and patterned on the masking layer 180, where the photo mask layer may be a soft mask.

In one or more embodiments, the photo mask layer may be patterned and developed to form photo mask blocks 191, and expose underlying portions of the masking layer 180. The photo mask blocks 191 may protect the covered portion of the masking layer 180, while exposed portions of the masking layer 180 may be etched to form mandrel templates 181 on the mandrel layer 170. In one or more embodiments, photo mask blocks 191 may be a soft mask, for example, PMMA. One or more photo mask blocks 191 may define the width, length, and pitch of the one or more mandrel templates and thereby, a pitch of the vertical fins.

In various embodiments, the pitch, $P_1$, between adjacent photo mask blocks 191 and/or mandrel template(s) 181 may be in the range of about 20 nm to about 200 nm, or in the range of about 30 nm to about 100 nm, or in the range of about 30 nm to about 50 nm, or about 42 nm.

Figure 8:
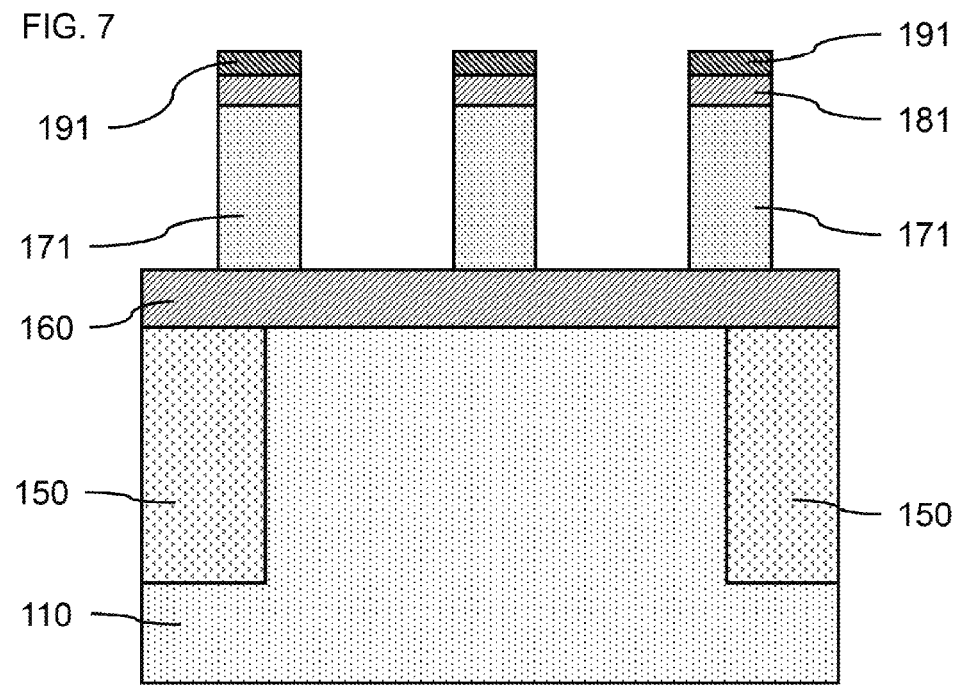
FIG. 8 is a cross-sectional side view of a plurality of photo mask blocks on the mandrel templates and sacrificial mandrels, in accordance with an exemplary embodiment.

FIG. 8 is a cross-sectional side view of a plurality of photo mask blocks on the mandrel templates and sacrificial mandrels, in accordance with an exemplary embodiment.

In one or more embodiments, the masking layer 180 may be etched to form one or more mandrel template(s) 181, where the photo mask blocks 191 defined the width, length, and location of the mandrel template(s) 181 on the substrate mandrel layer 170.

In one or more embodiments, a portion of the mandrel layer 170 may be removed to form one or more sacrificial mandrels 171 on the fin template layer 160.

In various embodiments, the mandrel layer 170 may be amorphous silicon, silicon-germanium, silicon oxide, silicon nitride, silicon oxynitride, amorphous carbon, or combinations thereof. The mandrel layer material may be selectively etchable versus the fin template material and/or masking layer material.

In one or more embodiments, the photo mask blocks 191 may be removed to expose the top surface(s) of the one or more mandrel template(s) 181. The photo mask blocks 191 may be removed by known methods (e.g., ashing, stripping, etc.).

Figure 9:
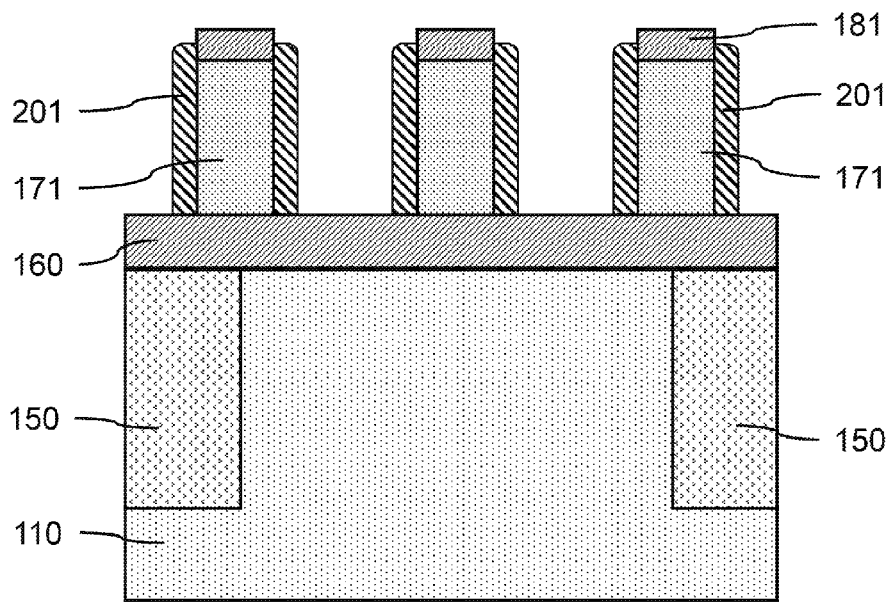
FIG. 9 is a cross-sectional side view of a plurality of spacers on the sacrificial mandrels and fin template layer, in accordance with an exemplary embodiment.

FIG. 9 is a cross-sectional side view of a plurality of spacers on the sacrificial mandrels and fin template layer, in accordance with an exemplary embodiment.

In one or more embodiments, spacers 201 may be formed on the sides of the sacrificial mandrel(s) 171. The spacers may be formed by deposition (e.g., CVD, ALD or thermal growth (e.g., thermal $SiO_2$) on the sides of the sacrificial mandrels 171. Spacer material may be removed from the surface of fin template layer 160 by etching back the spacer layer material, for example, by RIE.

In various embodiments the spacers 201 may be, for example, silicon oxide (SiO), silicon nitride (SiN), silicon boron carbonitride (SiBCN), silicon oxycarbide (SiOC), etc., where the spacer material may be selectively etchable versus the sacrificial mandrel material and/or fin template layer material. In a non-limiting exemplary embodiment, the spacers 201 may be thermally grown silicon oxide (SiO) on the sides of amorphous silicon sacrificial mandrels 171, where the growth of the SiO may consume a portion of the sidewalls of the sacrificial mandrels 171.

Figure 10:
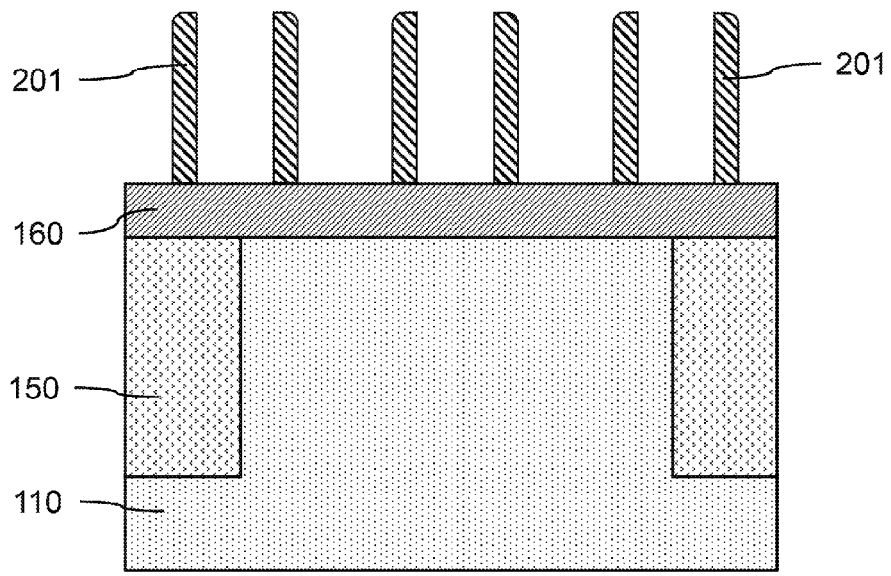
FIG. 10 is a cross-sectional side view of a plurality of spacers on the fin template layer on the substrate, in accordance with an exemplary embodiment.

FIG. 10 is a cross-sectional side view of a plurality of spacers on the fin template layer on the substrate, in accordance with an exemplary embodiment.

In various embodiments, the mandrel template(s) 181 may be removed to expose the underlying sacrificial mandrels 171, where the mandrel template(s) 181 may be removed by a selective etch, for example a selective RIE.

In one or more embodiments, the sacrificial mandrels 171 may be removed from between the spacers 201, where the sacrificial mandrels 171 may be removed by selective etching, for example a selective RIE. Removal of the sacrificial mandrels 171 may expose the underlying fin template layer 160 between the spacers 201.

Figure 11:
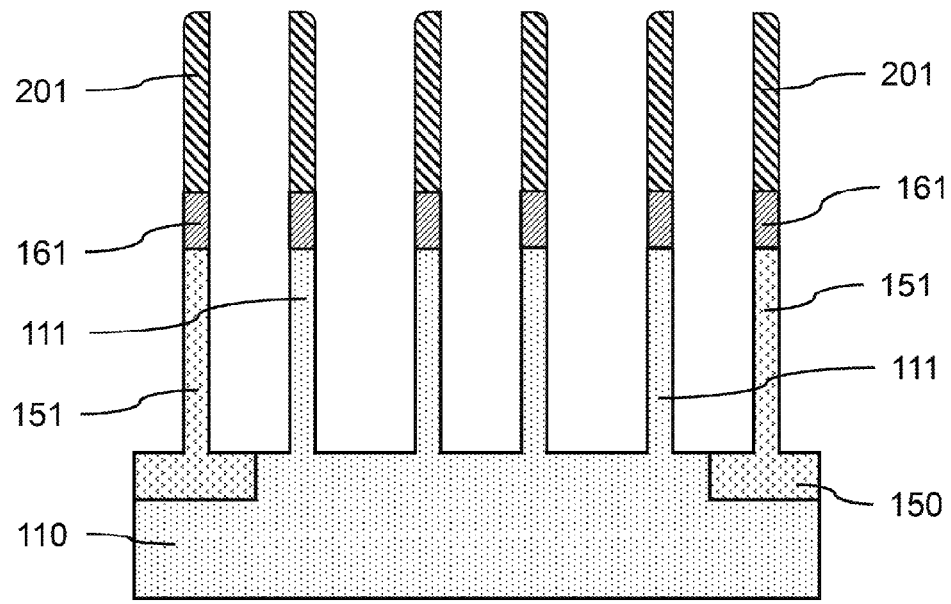
FIG. 11 is a cross-sectional side view of a plurality of spacers on the fin templates and vertical fins, in accordance with an exemplary embodiment.

FIG. 11 is a cross-sectional side view of a plurality of spacers on the fin templates and vertical fins, in accordance with an exemplary embodiment.

In one or more embodiments, portions of the fin template layer 160 not covered by a spacer 201 may be removed to form fin templates 161. The spacer pattern may be transferred to the fin template layer 160 for subsequent formation of a plurality of dummy fins 151 and/or vertical fins 111. In various embodiments, a sidewall image transfer (SIT) technique may be used to form one or more vertical fins 111 and dummy fins 151 on the substrate 110.

In one or more embodiments, portions of the substrate 110 between the fin template(s) 161 may be removed to form one or more vertical fin(s) 111. The portions of the substrate 110 may be removed by an anisotropic dry etch, for example, a dry plasma etch. The dry plasma etch may be a reactive ion etch (RIE) to provide a directional etch with control of sidewall etching. One or more dummy fin(s) 151 may be formed by removing a portion of the dummy fin fill 150, where the dummy fin fill may be adjacent to the portion of the substrate 110 also being removed. The dummy fin fill 150 and substrate 110 may be patterned and etched at the same time, where the dummy fin fill 150 and substrate 110 may have about the same etch rate for the RIE. A portion of dummy fin fill 150 may remain in the dummy fin trenches 140 below the dummy fin(s) 151.

In various embodiments, the vertical fin(s) 111 may be formed from the substrate material. The substrate 110 may be a single crystal Si substrate and the vertical fins may be single crystal silicon. In various embodiments, the vertical fin(s) 111 may be suitably doped to form channels of a vertical or horizontal finFET.

In various embodiments, the vertical fin(s) 111 and dummy fin(s) 151 may have a width in the range of about 4 nm to about 20 nm, or may have a width in the range of about 8 nm to about 15 nm, or in the range of about 10 nm to about 12 nm. In various embodiments, the vertical fin(s) 111 and dummy fin(s) 151 may have substantially the same height and width (e.g., within process tolerances/variations).

Figure 12:
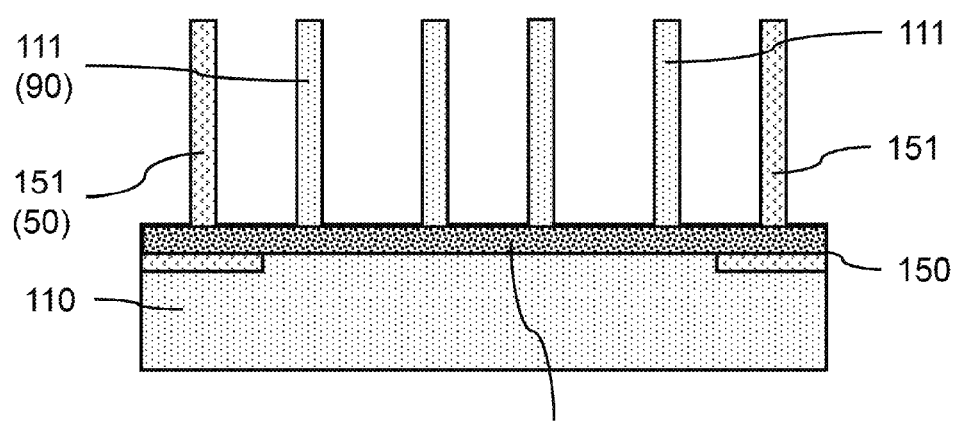
FIG. 12 is a cross-sectional side view of a plurality of vertical fins and dummy fins in a fin pattern region after removal of the spacers and fin templates, in accordance with an exemplary embodiment.

FIG. 12 is a cross-sectional side view of a plurality of vertical fins and dummy fins in a fin pattern region after removal of the spacers and fin templates, in accordance with an exemplary embodiment.

In one or more embodiments, the spacers 201 and the fin templates 161 may be removed to uncover the underlying vertical fin(s) 111 and dummy fin(s) 151. The spacers 201 and fin templates may be removed by selective etches that preferentially remove the spacer material and/or the fin template material. Two or more etching steps may be employed to remove the spacers 201 and the fin templates 161.

In one or more embodiments, the exposed dummy fin(s) 151 and vertical fin(s) 111 may make up a fin pattern 20 in a fin pattern region 10 on the substrate 110. The pitch between a dummy fin 151 and an adjacent vertical fin 111 may have been defined by the width and/or position of a sacrificial mandrel 171 and/or spacers 201.

In various embodiments, the one or more dummy fin(s) 151 may be located at the perimeter of the fin pattern region 10, such that dummy fins 151 are also border fins 50, whereas the vertical fins 111 may be interior fins 90 located within the perimeter and inside the bounds of the border fins 50.

In one or more embodiments, a doped region 230 may be formed in the substrate 110. The doped region 230 may be formed ex-situ below the vertical fin(s) 111. The dummy fin fill 150 in the dummy fin trenches 140 may act as a mask to prevent dopant implantation into substrate regions below a subsequent isolation region. One or more doped regions 230 may be formed in the substrate above which each of the one or more vertical fins may be formed. The dopant may be provided to the doped region(s) 230 by ion implantation, and source/drains formed by annealing the doped region(s). In various embodiments, the doped region 230 (i.e., source/drain region) may be n-doped or p-doped. The doped region 230 may form a bottom source/drain of a vertical fin field effect transistor (vertical finFET). In various embodiments, a plurality of vertical fins 111 may be electrically coupled to the same bottom source/drain to form a multi-fin vertical FET. The vertical fin(s) and bottom source/drain(s) may be suitably doped to form an NFET or a PFET.

The formation of a doped region 230 in a substrate may be optional, where a doped region 230 may be formed for fabricating vertical finFET devices with top and bottom source/drains, whereas a doped region may not be formed on the substrate 110 for fabrication of finFET(s) with source/drains at opposite ends of the vertical fin(s) and a horizontal current flow (i.e., horizontal finFETs).

Figure 17:
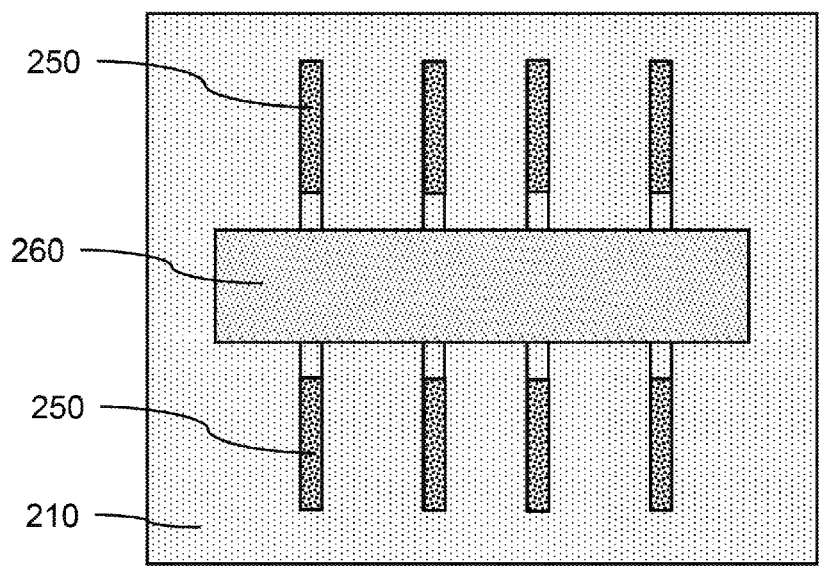
FIG. 17 is a top view of a gate structure on a plurality of vertical fins with source/drains at opposite ends of the fins, in accordance with an exemplary embodiment.
Figure 18:
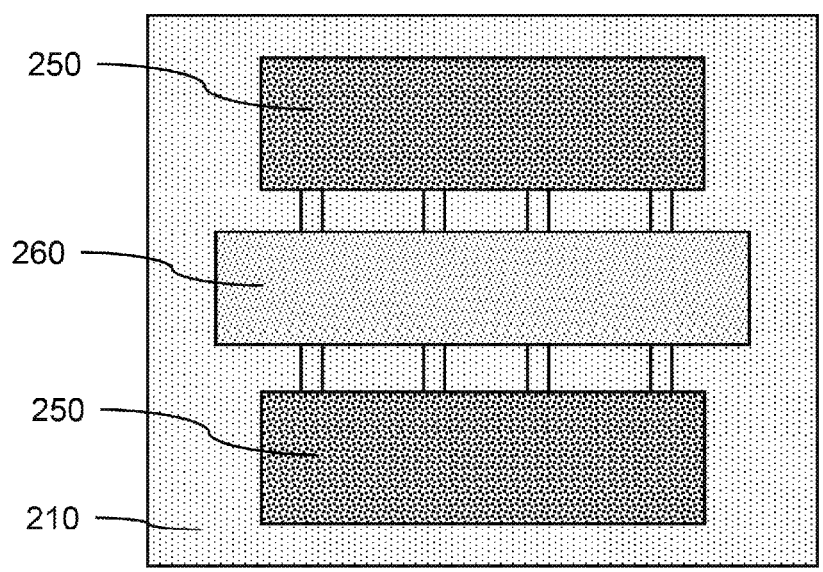
FIG. 18 is a top view of a gate structure on a plurality of vertical fins with source/drains at opposite ends of the fins, in accordance with an exemplary embodiment.
Figure 19:
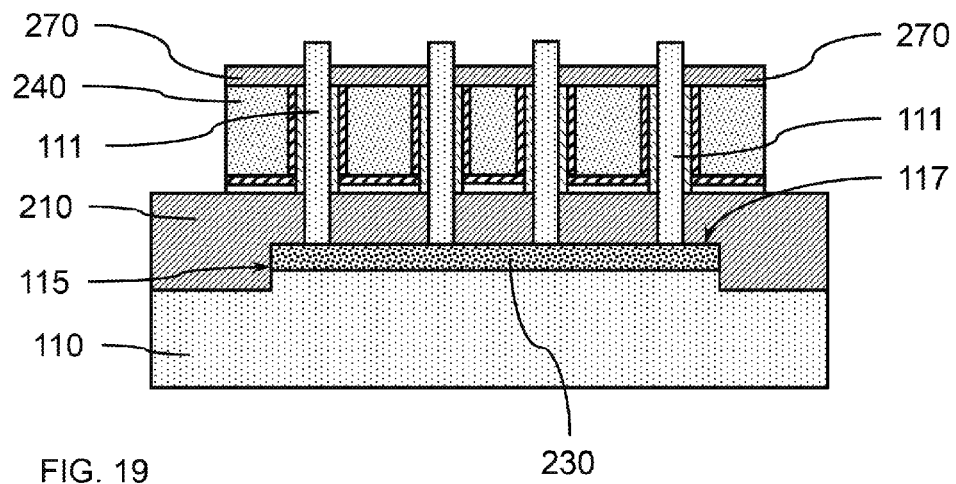
FIG. 19 is a cross-sectional side view of a top spacer formed on a reduced height gate dielectric layer, work function layer, and gate electrode layer, in accordance with an exemplary embodiment.
Figure 20:
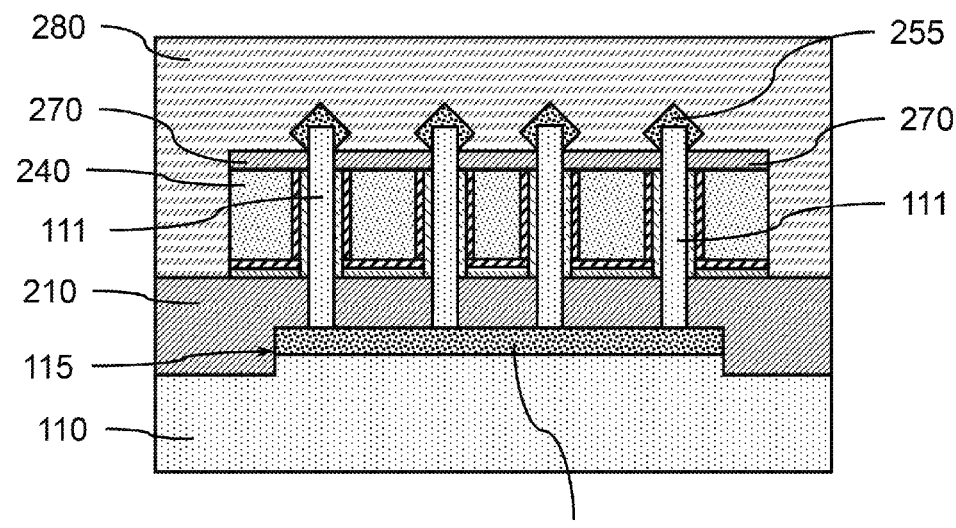
FIG. 20 is a cross-sectional side view of an interlayer dielectric and top source/drains formed on the top spacer and top portions of the vertical fins, in accordance with an exemplary embodiment.

Various embodiments for the fabrication of horizontal finFETs without a doped region 230 (i.e., bottom source/drain) is illustrated in FIGS. 14-18, whereas the fabrication of vertical finFET(s) having a doped region 230 is illustrated in FIGS. 19-20.

Figure 13:
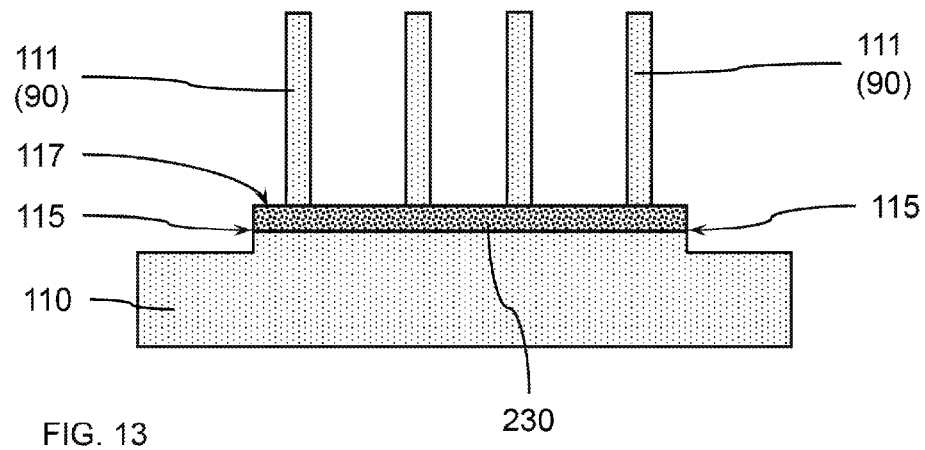
FIG. 13 is a cross-sectional side view of a plurality of vertical fins in a fin pattern region after removal of the dummy fins and fin fill, in accordance with an exemplary embodiment.

FIG. 13 is a cross-sectional side view of a plurality of vertical fins in a fin pattern region after removal of the dummy fins and fin fill, in accordance with an exemplary embodiment.

In one or more embodiments, the dummy fins 151 and dummy fin fill 150 may be removed to eliminate the border fins 50 that may have differing fin sizes, geometries, and/or profiles than the vertical fin(s) 111 that are interior fins 90. In various embodiments, the dummy fins 151 may be selectively etched versus the vertical fins 111. In a non-limiting exemplary embodiment, dummy fins 151 made of amorphous silicon, amorphous silicon-germanium, poly-crystalline silicon, or poly-crystalline silicon-germanium, may be selectively etched by use of hydrogen chloride gas (gaseous HCl) versus single crystal silicon vertical fins 111.

In various embodiments, after removal of the dummy fin fill 150, a step 115 may be present around at least a portion of the periphery of the interior fins 90, wherein the step 115 may have a height in the range of about 5 nm to about 50 nm, or about 10 nm to about 40 nm, from bottom of the dummy fin trench 140 to the substrate surface forming a ledge 117 adjacent to a vertical fin 111.

While the formation and removal of dummy fin(s) has been shown for border fins 50 in FIG. 1 and FIGS. 11-13, it is also contemplated that the process may also be applied to one or more interior fin(s) 90, as an alternative approach to a fin cut process and formation of shallow trench isolation regions between adjacent finFET devices.

Figure 14:
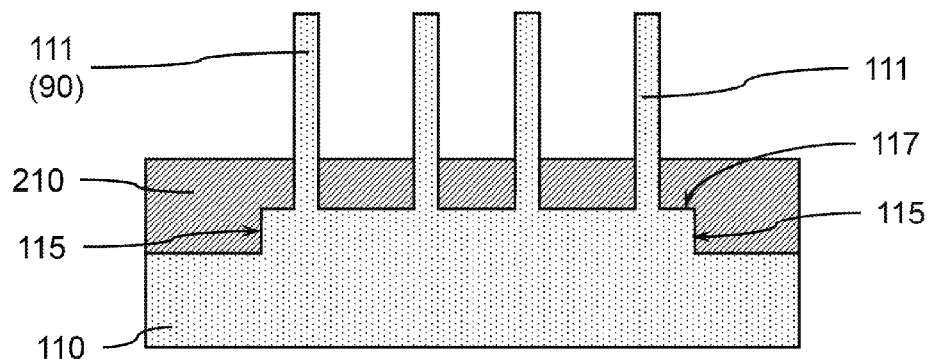
FIG. 14 is a cross-sectional side view of a bottom spacer layer and isolation region formed on a portion of the substrate, in accordance with an exemplary embodiment.

FIG. 14 is a cross-sectional side view of a bottom spacer layer and isolation region formed on a portion of the substrate, in accordance with an exemplary embodiment.

In one or more embodiments, a dielectric layer 210 may be formed on vertical fins 111, and at least a portion of the substrate 110 including dummy fin trenches 140. The dielectric layer 210 may be formed by a blanket deposition over the vertical fin(s) 111, where the blanket deposition may be a conformal deposition, for example, by ALD, CVD, or a combination thereof, or the deposition may be a directional deposition in which the dielectric layer 210 may be formed preferentially on the exposed surfaces of the substrate 110, for example, by PVD and/or gas cluster ion beam (GCIB) deposition.

In various embodiments, the dielectric layer 210 may form bottom spacers between vertical fin(s) 111 and an isolation region around the vertical fins 111 as part of the same deposition process. The dielectric layer 210 may be etched back from the vertical fin(s) 111 to form bottom spacers.

In one or more embodiments, the dielectric layer 210 may be an oxide, for example, silicon oxide (SiO) or a high-k metal oxide, or an insulating nitride, including but not limited to silicon nitride (SiN), or a silicon oxynitride (SiON).

In various embodiments, the dielectric layer 210 may be a high-K dielectric material that may include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-k material may further include dopants such as lanthanum and/or aluminum. The stoichiometry of the high-K compounds may vary.

In one or more embodiments, the portion of the dielectric layer 210 between the vertical fins forming a bottom layer may have a thickness in the range of about 3 nm to about 25 nm, or in the range of about 5 nm to about 20 nm. The thickness of the bottom spacer layer 140 may provide electrical isolation of a subsequently formed work function layer(s) and/or a conducting gate electrode layer from a doped source/drain region 230 in the substrate 110. The portion of the dielectric layer 210 in the dummy fin trenches 140 may have a thickness greater than the portion of the dielectric layer 210 between the vertical fins.

Figure 15:
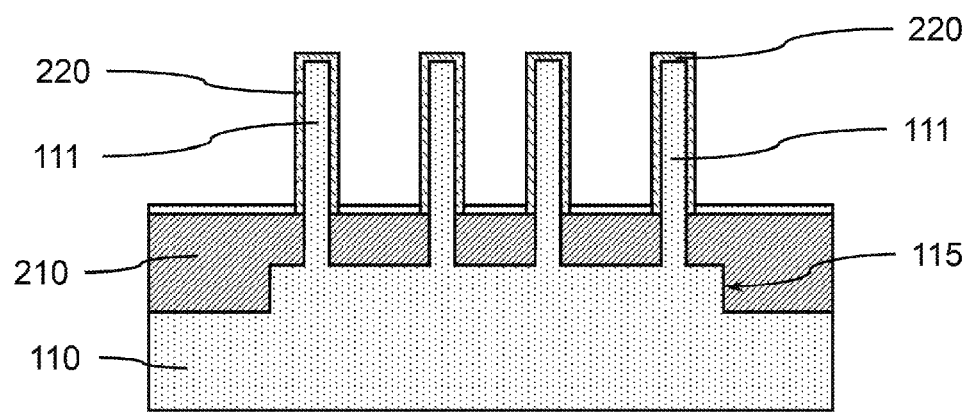
FIG. 15 is a cross-sectional side view of a gate dielectric layer formed on the exposed portions of the vertical fins, in accordance with an exemplary embodiment.

FIG. 15 is a cross-sectional side view of a gate dielectric layer formed on the exposed portions of the vertical fins, in accordance with an exemplary embodiment.

In one or more embodiments, a gate dielectric layer 220 may be formed on at least a portion of the vertical fin(s) 111. The gate dielectric layer 220 formed on at least opposite sidewalls of the same vertical fin 111 may form part of a gate structure of a vertical finFET, where the gate dielectric layer 220 may wrap around the sidewalls and endwalls to encase the vertical fin 111 in the gate dielectric layer 220.

In one or more embodiments, a gate structure may be formed on the vertical fins 111 by depositing a gate dielectric layer 220 on at least a portion of the exposed sidewall of the vertical fin(s) 111, where the gate dielectric layer 150 may also be formed on at least a portion of the dielectric layer 210. The gate dielectric layer 220 may be conformally deposited, for example, by CVD, ALD, or a combination thereof. Undesired portions of the gate dielectric layer 220 may be removed by a directional etch, for example, RIE.

In various embodiments, the gate dielectric layer 220 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-k material may further include dopants such as lanthanum and/or aluminum. The stoichiometry of the high-k compounds may vary.

Figure 16:
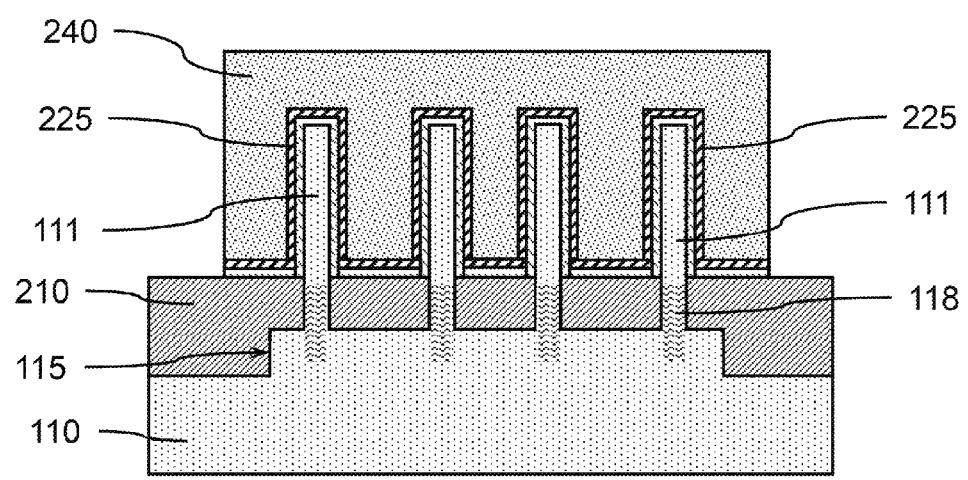
FIG. 16 is a cross-sectional side view of a work function layer and a gate electrode formed on the gate dielectric layer, in accordance with an exemplary embodiment.

FIG. 16 is a cross-sectional side view of a work function layer and a gate electrode formed on the gate dielectric layer, in accordance with an exemplary embodiment.

In one or more embodiments, a work function layer 225 may be formed on the gate dielectric layer 220, where the work function layer may be deposited over the gate dielectric layer 220 by CVD and/or ALD. The work function layer 225 may form part of the gate structure, where the gate structure may be on one or more vertical fin(s) 111. In various embodiments, a work function layer 225 may be formed on the gate dielectric layer 220 between the gate dielectric layer 220 and the gate electrode layer 240.

In various embodiments, a work function layer 225 may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); and combinations thereof.

In various embodiments, the work function layer 225 may have a thickness in the range of about 3 nm to about 11 nm, or may have a thickness in the range of about 5 nm to about 8 nm.

In one or more embodiments, a gate electrode layer 240 may be formed on the gate dielectric layer 220 and/or work function layer 225, where the gate electrode layer 240 may be a conductive material that forms part of a gate structure on one or more vertical fin(s) 111. In various embodiments, the gate electrode layer 240 may be formed on the dielectric layer 210, gate dielectric layer 220, and/or work function layer 225. The gate electrode layer 240 may be formed by a blanket deposition that covers a portion of one or more vertical fins 111, for example, by ALD, CVD, PVD, or a combination thereof. A masking layer may be formed before depositing the gate electrode layer 240 to define the regions to be covered by the gate electrode layer, as would be known in the art. The gate electrode layer may extend above the masking layer, and may be at least partially removed by CMP. The masking layer may be removed after formation of the gate electrode layer, as would be known in the art.

In various embodiments, portions of the gate dielectric layer 220 and work function layer 225 may be removed from portions of the vertical fin(s) 111 where source/drains may subsequently be formed.

In various embodiments, the gate structure, including a gate dielectric layer 220, a work function layer 225, and a gate electrode layer 240, may be formed across a plurality of vertical fins 111, where the vertical fins are coupled to the same doped region 230 in the substrate 110 forming a bottom source/drain. The plurality of coupled and gated fins may form a multi-fin horizontal transistor device, which may include source/drains at opposite ends of the vertical fin(s) 111, where the vertical fin(s) form the channel(s) of the horizontal transistor device.

In various embodiments, the gate electrode layer 240 may be a conductive metal, where the metal may be tungsten (W), titanium (Ti), molybdenum (Mo), cobalt (Co), or a conductive carbon material (e.g., carbon nanotube, graphene, etc.), or any suitable combinations thereof.

In one or more embodiments, a punch-through stop (PTS) 118 may be formed in a lower portion of the one or more vertical fin(s) 111 by implanting a counter-dopant of opposite polarity of the source/drains for the NFET or PFET with a horizontal current flow. The PTS 118 may be formed in at least a portion of a vertical fin 111 below the intended region of the FET channel. The doping polarity in PTS region is opposite to the doping polarity of source/drain so that source and drain are electrically isolated by two pn junctions between the PTS-to-source and/or PTS-to-drain interface. For example, for an n-type lateral FinFET, the source/drains are doped with n-type dopants, so a PTS would be doped with p-type dopants. The PTS doping may be done by doping techniques known in the art, such as implantation.

FIG. 17 is a top view of a gate structure on a plurality of vertical fins with source/drains at opposite ends of the fins, in accordance with an exemplary embodiment.

In one or more embodiments, a portion of the one or more vertical fin(s) forming a device may be implanted with dopant(s) to form source/drain(s) 250 at opposite ends of the vertical fin(s). The source/drain may be formed by implantation or other suitable doping techniques known in the art, for example, in-situ doped epitaxy.

In one or more embodiments, the gate structure 260 may be located on approximately a central portion of the vertical fin(s) 111 between the source/drains 250. A gate structure formed on a vertical fin for a finFET with current flow parallel to the plane of the substrate (i.e., laterally) may have a gate length in the range of about 10 nm to about 50 nm, or about 20 nm to about 30 nm, although other gate lengths are contemplated.

FIG. 18 is a top view of a gate structure on a plurality of vertical fins with source/drains at opposite ends of the fins, in accordance with an exemplary embodiment.

In one or more embodiments, source/drains 250 implanted with dopant(s) may be formed at opposite ends of the vertical fin(s), where the source/drains may be formed across the vertical fins 111 forming a multi-fin device, such that the fins are electrically coupled to the same source/drains 250 sharing the same gate structure 260. The gate structure 260 may be located on approximately a central portion of the vertical fin(s) 111 between the source/drains 250. In various embodiments, the source/drains 250 may be epitaxially grown blocks doped in-situ during formation.

In one or more embodiments, a dielectric fill 210 may be formed in the one or more fin trench(es) 180 to electrically isolate neighboring vertical fin segments 116. The dielectric fill 210 may be a silicon oxide (SiO), a low-k oxide (e.g., fluorine doped SiO, carbon doped SiO, porous SiO, etc.), or combinations thereof. The dielectric fill 210 may be an insulating material that forms a shallow trench isolation region.

In various embodiments, the top source/drain 250, bottom source/drain, and vertical fin segments 116 form at least a portion of a vertical finFET. In various embodiments, the top source/drain 250 and bottom source/drain may be n-doped or p-doped. The top source/drain 250 and bottom source/drain also may be interchanged.

FIG. 19 is a cross-sectional side view of a top spacer formed on a reduced height gate dielectric layer, work function layer, and gate electrode layer, in accordance with an exemplary embodiment.

In one or more embodiments, portions of the gate electrode layer 240, work function layer 225, and gate dielectric layer 220 may be removed to reduce the height of the gate electrode layer 240, work function layer 225, and gate dielectric layer 220 sufficiently below the top surface of the vertical fin(s) 111 to allow space for formation of a top spacer 270 and a top source/drain to form a vertical finFET.

In various embodiments, the top spacer 270 may be an insulation material, where the top spacer material may be an oxide, for example, silicon oxide (SiO) or a high-k metal oxide, or an insulating nitride, including but not limited to silicon nitride (SiN), or a silicon oxynitride (SiON).

FIG. 20 is a cross-sectional side view of an interlayer dielectric and top source/drains formed on the top spacer and top portions of the vertical fins, in accordance with an exemplary embodiment.

In one or more embodiments, top source/drains 255 may be formed on the top portions of one or more vertical fin(s) 111, where the top source/drains may be epitaxially grown on single crystal vertical fin(s). A doped region 230 in the substrate below the one or more vertical fin(s) 111 may form a bottom source/drain, where the source/drains may be n-doped or p-doped to form an NFET or a PFET. In various embodiments, the source and drain may be on opposite ends of a fin, such that a source may be at the top or the bottom, and the drain may be at the opposite side of the fin from the source, and the vertical fin forms a channel.

In one or more embodiments, an interlayer dielectric 280 may be formed on the top spacer 270 and top source/drains 255, where the interlayer dielectric (ILD) may electrically isolate portions of the vertical finFET from each other. In various embodiments, electrical contacts may be formed to the top source/drains 255 and gate structures through the ILD 280, where the top source/drains 255 and gate structures may be electrically coupled together to form multi-fin finFETs.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath"

other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor (finFET) having fin(s) with reduced dimensional variations, comprising:
    forming two dummy fin trenches in a substrate, wherein each of the two dummy fin trenches is on opposite sides of a portion of the substrate;
    forming a dummy fin fill in each of the two dummy fin trenches;
    forming a first dummy fin from one of the dummy fin fills, a second dummy fin from the other of the two dummy fin fills, and a vertical fin from the portion of the substrate between the two dummy fin trenches, wherein the first dummy fin and second dummy fin are border fins and the vertical fin is an interior fin; and
    removing the border fins.

2. The method of claim 1, wherein the border fins and interior fin have a width in the range of about 4 nm to about 20 nm.

3. The method of claim 1, wherein the dummy fin fill and the border fins are made of amorphous silicon (a-Si), poly-crystalline silicon (p-Si), amorphous silicon-germanium (a-SiGe), or poly-crystalline silicon-germanium (p-SiGe).

4. The method of claim 3, wherein the vertical fin is single crystal silicon, and the border fins are removed by a selective HCl etch.

5. The method of claim 1, wherein the width of each of the two dummy fin trenches is in the range of about 30 nm to about 300 nm.

6. The method of claim 5, wherein the depth of each of the two dummy fin trenches is in the range of 20 nm to about 200 nm.

7. The method of claim 6, further comprising forming a doped region in the portion of the substrate.

8. The method of claim 7, further comprising forming a gate structure on the vertical fin.

9. The method of claim 8, forming a punch-through stop in a lower portion of the vertical fin.

10. The method of claim 9, further comprising forming a top source/drain on the vertical fin.

\* \* \* \* \*